United States Patent

[11] 3,582,864

[72] Inventor James L. Sullivan
1504 Highland Ave., Manhattan Beach, Calif. 90266

[21] Appl. No. 867,831
[22] Filed Oct. 20, 1969
[45] Patented June 1, 1971

[54] ELECTRICALLY CONDUCTING DEVICE
4 Claims, 3 Drawing Figs.

[52] U.S. Cl. .......... 339/19, 339/22, 339/242
[51] Int. Cl. .......... H01r 31/08
[50] Field of Search .......... 339/19, 22 R, 256, 258, 242; 24/81 B

[56] References Cited
UNITED STATES PATENTS 2,940,145 6/1960 Fernberg .......... 24/81 (B)
3,488,620 1/1970 Sullivan et al. .......... 339/19
3,496,517 2/1970 Walter .......... 339/18

*Primary Examiner*—Marvin A. Champion
*Assistant Examiner*—Robert A. Hafer
*Attorney*—Jack C. Munro

ABSTRACT: An electrical conducting device for a plurality of independent electrical contacts arranged in a row, the electrical conducting device having a single electrically conducting strip to be alignable adjacent the row of electrical contacts and capable of being electrically conductive therebetween, a plurality of spring-biased arms being attached to the strip to permit connection of the conductor to the contacts, each of the arms being capable of being separated from the strip, a nonelectrically conducting element being placeable upon the strip in the areas provided by the separated arms.

PATENTED JUN 1 1971 3,582,864

JAMES L. SULLIVAN
INVENTOR.

BY

Jack C. Munro
AGENT

ELECTRICALLY CONDUCTING DEVICE

BACKGROUND OF THE INVENTION

The field of this invention relates to electrical conductors and more specifically to an electrical conductor for a row of terminal posts of a terminal board.

In electrical circuitry it has been found to be of great advantage to mount the transistors, inductors, resistors, capacitors, etc., on a terminal board with the terminal board being installed within the overall electrical apparatus. Common types of overall apparatus are computers, space circuitry, telephone connections, household appliances, etc. One purpose of the terminal board is to facilitate ease of installation of the electrical elements. Also, another purpose is that the board may be easily removed from the entire apparatus and defective elements easily replaced. Such boards are usually composed of a base of metallic material (nonmetallic, if desired) with a series of female type of electrical connections mounted on one side of the board. Each of the female electrical connections terminate on the opposite side of the board in a terminal post. If the board is metallic, thereby electrically conducting, each of the posts is electrically insulated against the board. The female connections of the board are to cooperate with corresponding male connections of the particular overall electrical apparatus.

In the employment of such a board having a great many of the terminal posts thereon, it frequently is desirable to connect adjacent posts for the passage of electrical current. One means which has been commonly used has been to merely employ an electrically conducting wire and solder the wire to each of the series of posts. As it is common for there to be a series of rows of terminals (for instance 10 to 12 rows of 15 to 20 terminal posts each) and the rows of the terminal posts are spaced relatively close together, it is quite difficult to use a soldering gun in such spaced quarters and obtain an adequate electrical connection. To overcome the disadvantages of the solder type of connection, a solderless connection has been developed which is usually referred to as a "wire wrap." Each of the terminal posts are either square or rectangular in configuration resulting in each post having four sharp corners. Wire wrapping is accomplished by taking a small-gauged wire and winding the wire around a specific terminal post a plurality of times (usually six or seven times). Next, the same piece of wire is wound around each of the posts desired to form the common electrical connection, the wire itself making this connection as each of the posts has four sharp corners and the wire wrap is wound tightly about each post, the wire is imbedded in the sharp edges of each of the posts thereby achieving a sound electrical connection. However, one of the main disadvantages of the wire wrap technique is the man hours necessary to accomplish the installation. Further, as the size of the wire employed is limited, usually 28 to 30 gauge wire, current-carrying capacity is also limited. Further, a common disadvantage of both the soldering method and the wire wrap method is that both types of connections are not easily removable. In other words, if it is desirable to alter the connections for any reason, it is usually difficult to do so, as the wire must be unsoldered and/or unwrapped and then the wire being discarded and replaced.

Frequently, it is necessary to bypass electrically a specific terminal post in the row or several posts in the row. In the wire wrap technique or the common wire and solder method, to electrically bypass a post or posts in a single row is not accomplished with ease. Besides the time involved in the performing of the bypass, it is common for the portion of the bypassed wire to eventually contact the bypassed post resulting in an electrical short circuit. It would be desirable to employ an apparatus which facilitated the bypass of a post or posts and also facilitated the installation thereof.

SUMMARY OF THE INVENTION

The electrical conducting device of this invention is formed of an elongated sheet metal strip and a plurality of spring-biased arms extending from the strip. Each arm has a curved apex portion and a body portion with the apex portion being connected to an edge of the strip and the body portion being adjacently spaced from a flat surface of the strip. Within the apex portion of each arm is an aperture which is to permit the insertion of a terminal post therethrough and the post extending between the strip and the body portion of the arm. Each of the arms is capable of being separated from the strip at the apex portion by a failure of the material of construction. In the areas of the strip where an arm or arms have been removed therefrom, an electrically insulating material is to be secured to the strip.

One of the primary objects of this invention is to employ an electrically conducting strip for a row of terminal posts wherein the option exists of choosing which of the posts are to be common electrically.

DESCRIPTION OF THE SHOWN EMBODIMENT

Figure 1:
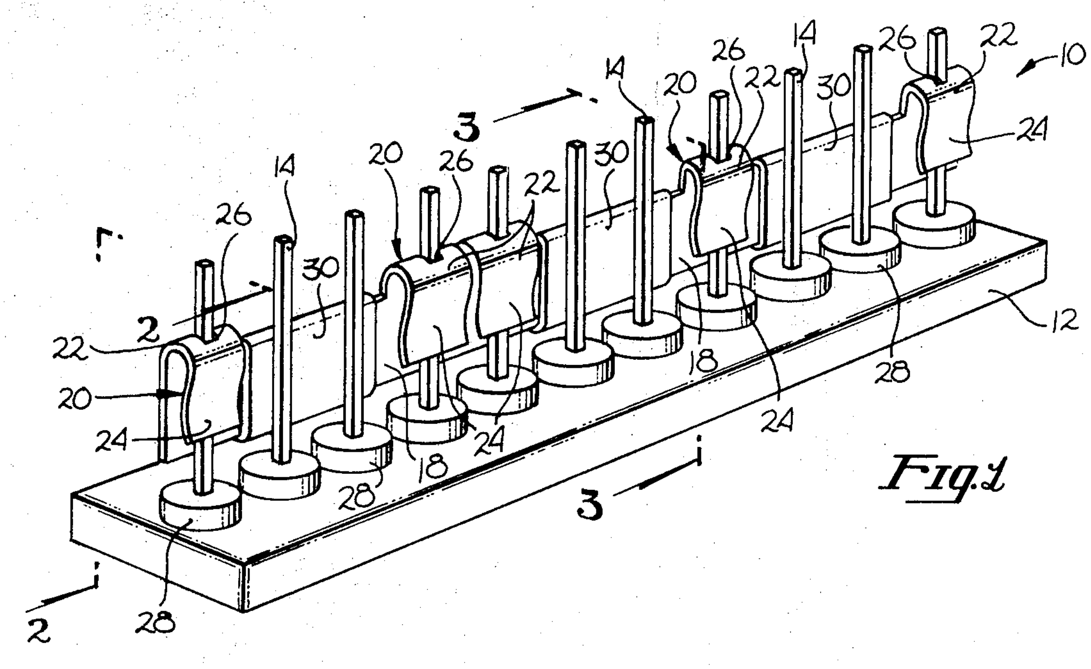
FIG. 1 is a pictorial view of applicant's conducting strip as employed in conjunction with a plurality of terminal posts of a terminal board.
Figure 2:
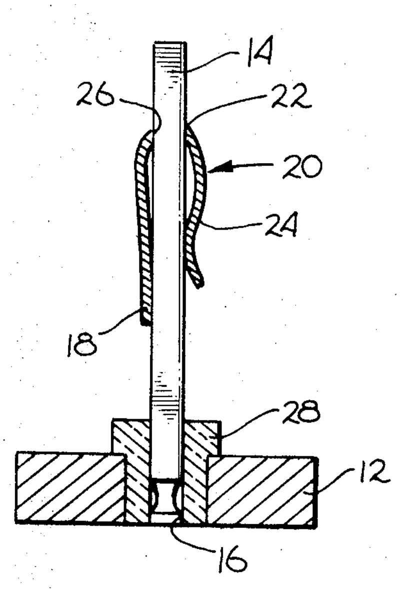
FIG. 2 is a partly in section side view showing in more detail a portion of applicant's conducting strip taken along line 2–2 of FIG. 1.
Figure 3:
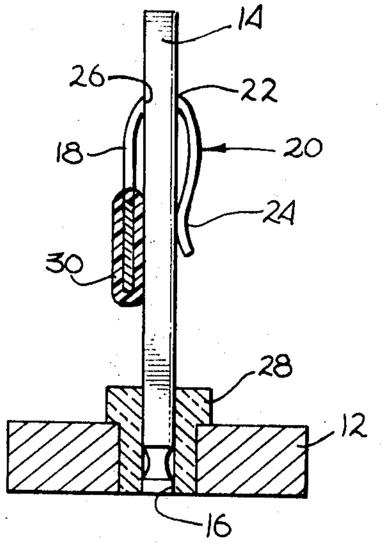
FIG. 3 is a partly in section side view similar to FIG. 2 taken along line 3–3 of FIG. 1 showing another portion of the strip of applicant's invention.

Referring particularly to FIG. 1 of the drawing, there is shown the electrically conducting device 10 of applicant's invention employed in conjunction with a terminal board 12. Projecting perpendicularly from the surface of the terminal board 12 are a plurality of terminal posts 14. As shown in the drawing the posts 14 are aligned in a single row, only one row being shown. However, it is to be understood that each terminal board 12 would have a plurality of rows of posts 14. Each of the terminal posts 14 are depicted as being square in configuration. However, it is to be understood that the particular manner of design of the terminal posts does not specifically form a part of this invention. It has only been found that a post which has been formed to include sharp corners gives greater reliability as to electrical connections established therewith. Any polygonal shape of post would serve as being satisfactory.

Located on the underside of the terminal board 12 are a series of electrical female connectors 16. It should be readily apparent from the drawing that there is one connector 16 per terminal post with each of the connectors 16 being integrally attached to its particular terminal post 14. The use of the female connector 16 permits attachment of the terminal board to corresponding male circuitry in which the terminal board is to be employed. It is to be understood that to use female connectors on the opposite side of the terminal board forms no direct part of this invention. It is contemplated that any type of terminals could be employed as, for example, male terminal posts.

The device 10 of applicant's invention has an elongated strip 18 which is to be capable of conducting electrical current. Extending from a single edge of the strip 18 are a plurality of arms 20, each arm 20 having an apex portion 22 and a body portion 24. The body portion 24 is spaced a short distance from the surface of strip 18. Within the apex portion 22 of each arm 20 is an aperture 26. A terminal post 14 is to be insertable through aperture 26 and extend between body portion 24 and strip 18 with the post 14 in a contactual relationship with both the strip 18 and the body portion 24. Each of the arms 20 are biased tending to maintain the contactual relationship with their respective post 14. Each of the posts 14 are supported within the terminal board 12 by means of an insulator 28. The spacing between adjacent posts 14 are to be identical to the spacing of the apertures 26 in adjacent arms 20.

Each of the arms 20 are capable of being "broken away" from the strip 18 at the apex portion 22. The separation is accomplished by manually pivoting each of the arms 20 to a position adjacent the opposite side of the strip 18. As a result, failure of the material of construction occurs. A nonelectrically conducting material 30 is to be locatable about the strip 18 in the areas of removed arms 20.

To place the device 10 about a row of posts 14, the procedure is as follows: Prior to installation of the device 10 it is ascertained which posts 14 are to be connected electrically in the particular electrical apparatus. The arms 20 which correspond to the posts 14 to which it is not desired to connect electrically, are removed from the strip 18. A segment of heat-shrink tubing 30 is placed about strip 18 and heat energy applied thereto to cause the tubing 30 to shrink about strip 18 in a snug-fitting manner. The device 10 is then placed over the series of posts 14 with the posts 14 which are to be made electrically common being inserted through an aperture 26 of an arm 20. Thereby, the posts 14 which cooperate with an arm 20 are electrically common with one another. The other posts 14 in the row are prevented from joining in the common electrical connection by reason of the tubing 30 located between the strip 18 and the post 14.

I claim:

1. In combination with an electrical terminal board, said terminal board having a plurality of spaced terminal posts extending therefrom, said posts being arranged in a row, each of said posts being electrically insulated with respect to each other, an electrical conducting device comprising:

an elongated electrically conducting strip;

a plurality of arms being connected to said strip, each of said arms having an apex portion and a body portion, said body portion being substantially parallel to the surface of said strip and normally spaced a predetermined distance from said strip, each of said arms being detachable from said strip by causing a material failure therebetween;

an aperture being located in the apex portion of each of said arms, each of said apertures being capable of permitting insertion of one of said posts therethrough and locating said post between said strip and said body portion in an electrically conducting relationship.

2. An apparatus as defined in claim 1 wherein:

each of said arms being resilient, said predetermined distance being less than the thickness of said posts.

3. An apparatus as defined in claim 2 wherein:

upon detaching of an arm from said strip a nonelectrically conducting material being applied to said strip in the area of the removed arm.

4. An apparatus as defined in claim 3 wherein:

said apex portion being less in length than said body portion, said body portion extending over one-half the width of said strip.